(12) United States Patent
Takagiwa et al.

(10) Patent No.: US 9,093,159 B2
(45) Date of Patent: Jul. 28, 2015

(54) SEMICONDUCTOR MEMORY DEVICE

(71) Applicant: Kabushiki Kaisha Toshiba, Minato-ku (JP)

(72) Inventors: Teruo Takagiwa, Kanagawa (JP); Masatsugu Ogawa, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/206,631

(22) Filed: Mar. 12, 2014

(65) Prior Publication Data

US 2015/0078091 A1 Mar. 19, 2015

Related U.S. Application Data

(60) Provisional application No. 61/877,407, filed on Sep. 13, 2013.

(51) Int. Cl.
*G11C 11/34* (2006.01)
*G11C 16/10* (2006.01)

(52) U.S. Cl.
CPC ..................................... *G11C 16/10* (2013.01)

(58) Field of Classification Search
USPC ............. 365/185.11, 185.12, 185.17, 185.18, 365/185.21, 185.33
See application file for complete search history.

(56) References Cited

U.S. PATENT DOCUMENTS

| | | | | |
|---|---|---|---|---|
| 8,102,717 B2 * | 1/2012 | Cha et al. | | 365/185.18 |
| 8,179,722 B2 * | 5/2012 | Huh | | 365/185.12 |
| 8,270,215 B2 * | 9/2012 | You et al. | | 365/185.12 |
| 8,351,257 B2 * | 1/2013 | Kim | | 365/185.18 |
| 8,395,940 B2 * | 3/2013 | Huh | | 365/185.12 |
| 8,520,442 B2 * | 8/2013 | Yoon | | 365/185.18 |
| 8,824,207 B2 * | 9/2014 | Kim et al. | | 365/185.12 |
| 8,902,646 B2 * | 12/2014 | Koo et al. | | 365/185.21 |
| 8,902,675 B2 * | 12/2014 | Takagiwa | | 365/185.17 |
| 2014/0063963 A1 | 3/2014 | Li et al. | | |

FOREIGN PATENT DOCUMENTS

| | | |
|---|---|---|
| JP | 2004-296088 A | 10/2004 |
| JP | 2014-49173 A | 3/2014 |

* cited by examiner

*Primary Examiner* — Trong Phan
(74) *Attorney, Agent, or Firm* — Oblon, McClelland, Maier & Neustadt, L.L.P.

(57) ABSTRACT

According to one embodiment, a semiconductor memory device includes: a memory cell array; a first data latch; a second data latch; a first data bus; a second data bus; a first temporary latch; a second temporary latch; and a control unit. The first and the second data latches are electrically connected to the memory cell array. The first data bus is electrically connected to the first data latch. The second data bus is electrically connected to the second data latch. The first temporary latch is electrically connected to the first data bus. The second temporary latch is electrically connected to the second data bus. The control unit is configured to write data on the first temporary latch and transfer data retained in the first temporary latch to the first data latch while writing data on the second temporary latch.

12 Claims, 11 Drawing Sheets

US 9,093,159 B2

SEMICONDUCTOR MEMORY DEVICE

CROSS-REFERENCE TO RELATED APPLICATIONS

This application is based upon and claims the benefit of priority from U.S. Provisional Patent Application 61/877,407, filed on Sep. 13, 2013; the entire contents of which are incorporated herein by reference.

BACKGROUND OF THE INVENTION

1. Field

Embodiments described herein relate generally to a semiconductor memory device.

2. Background

A NAND flash memory is known as a nonvolatile semiconductor memory device.

DETAILED DESCRIPTION

In general, according to one embodiment, a semiconductor memory device includes: a memory cell array including a plurality of memory cells; a first data latch electrically connected to the memory cell array; a second data latch electrically connected to the memory cell array; a first data bus electrically connected to the first data latch; a second data bus electrically connected to the second data latch; a first temporary latch electrically connected to the first data bus; a second temporary latch electrically connected to the second data bus; and a control unit configured to write data on the first temporary latch and transfer data retained in the first temporary latch to the first data latch while writing data on the second temporary latch.

Hereinbelow, embodiments of the invention are described with reference to the drawings.

Figure 1:
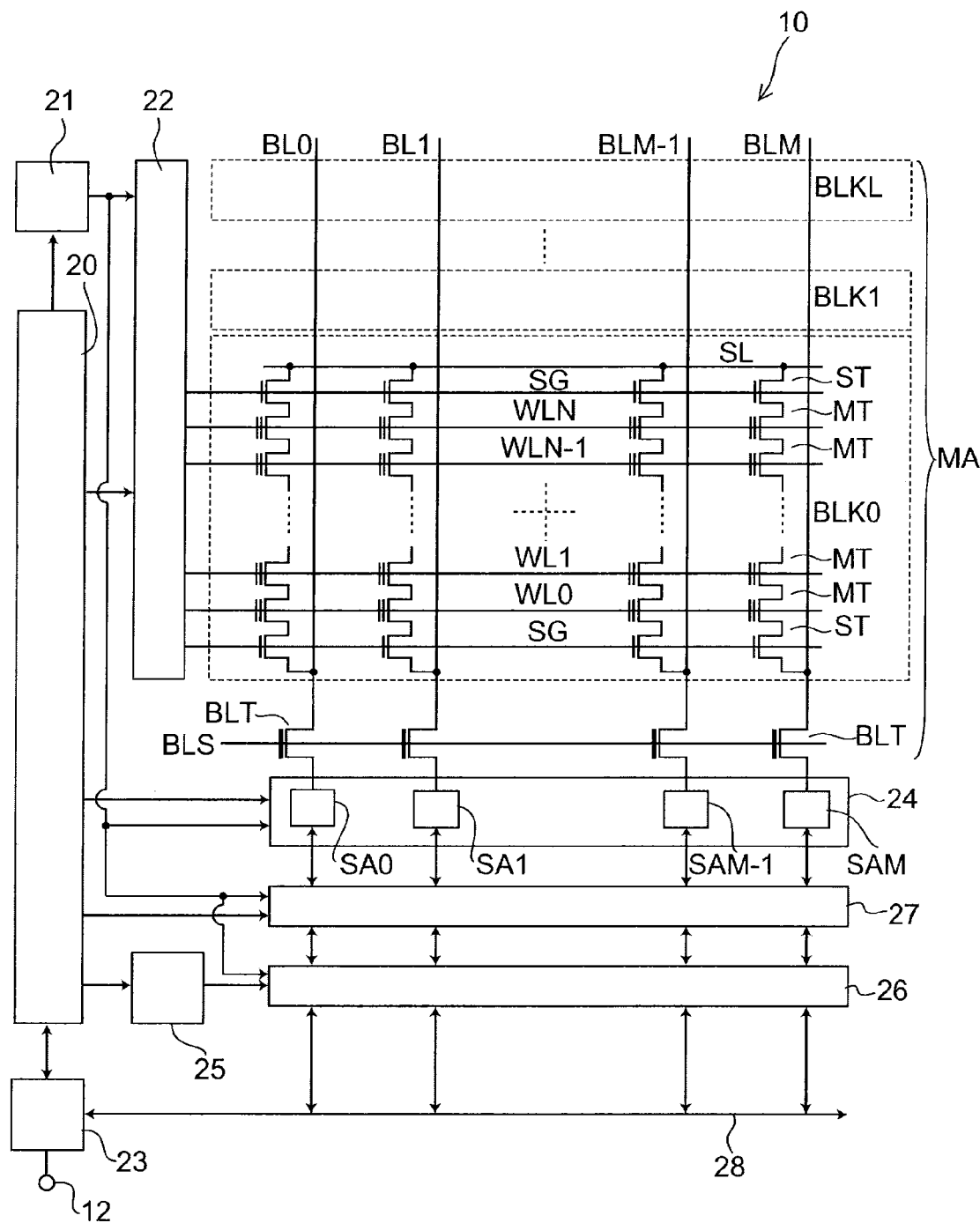
FIG. 1 is a block diagram schematically showing a semiconductor memory device according to an embodiment.

FIG. 1 is a block diagram schematically showing a semiconductor memory device according to an embodiment.

As shown in FIG. 1, a semiconductor memory device 10 includes a memory cell array MA and a control circuit (a peripheral circuit) that controls the operation of the memory cell array MA. The memory cell array MA and the control circuit are formed to be integrated on the same substrate (one chip), for example.

The memory cell array MA includes a plurality of blocks BLK0 to BLKL (hereinafter, occasionally collectively referred to as a "block BLK", L being an integer of 0 or more).

The memory cell array MA further includes a plurality of bit lines BL0 to BLM (hereinafter, occasionally collectively referred to as a "bit line BL", M being an integer of 0 or more), a plurality of word lines WL0 to WLN (hereinafter, occasionally collectively referred to as a "word line WL", N being an integer of 0 or more), a source line SL, a select gate line SG, and a bit line control line BLS.

One select transistor ST, (N+1) memory cell transistors MT (memory cells), and one select transistor ST are connected in series in this order between the bit line BL and the source line SL. Thereby, a memory string is formed.

The gate electrode of the select transistor ST is connected to the select gate line SG. The gate electrode of the memory cell transistor MT is connected to the word line WL. M memory strings connected to one source line SL constitute one block BLK. M memory cell transistors MT sharing one word line WL constitute a "page". The definition of the page is not limited to this case, and part of all the memory cells sharing one word line WL may be taken as one page, for example.

The direction in which the bit line BL extends is different from the direction in which the word line WL extends (for example, orthogonal). The memory cell transistor MT is electrically connected between the bit line BL and the word line WL.

The memory cell transistor MT has a structure in which a control electrode is stacked on a charge storage layer such as a floating electrode and a charge trap film via an intermediate insulating film, for example. The memory cell is not limited to the memory cell transistor MT but may be any memory element that can retain data.

The control circuit includes a control unit 20, a voltage generation circuit 21, a row decoder 22, a data input/output buffer 23, a sense amplifier circuit 24, a column decoder 25, a gate circuit 26, a page buffer 27, a common bus 28, etc. The control circuit performs the writing, erasing, and reading of data on the memory cell transistor MT.

The word line WL is connected to the row decoder 22. The row decoder 22 selects and drives the word line WL.

The bit line BL is connected to the sense amplifier circuit 24. The sense amplifier circuit 24 includes a plurality of sense amplifiers SA0 to SAM (hereinafter, occasionally collectively referred to as a "sense amplifier SA"). Each bit line BL is electrically connected to each sense amplifier SA through a respective transistor BLT.

The sense amplifier SA applies an electric potential to the bit line BL; and determines whether the memory cell transistor MT is in the ON state or in the OFF state and reads data written in the memory cell transistor MT.

The data input/output buffer 23 is electrically connected to a data input/output terminal 12, the control unit 20, and the common bus 28. The common bus 28 is electrically connected to the gate circuit 26.

The data input/output buffer 23 gives and receives various data such as write data, command data, and address data from the outside via the data input/output terminal 12.

The data input/output buffer 23 temporarily retains data inputted from the outside, and outputs the retained data to the control unit 20 or the gate circuit 26.

The data input/output buffer 23 receives data read from the memory cell array MA from the gate circuit 26 and retains the data temporarily, and outputs the retained data to the outside from the data input/output terminal 12.

The gate circuit 26 includes a plurality column gates, and selectively switches the bit line BL connected to the common bus 28 by means of the plurality of column gates. In other words, the gate circuit 26 selectively switches the sense amplifier SA connected to the common bus 28 by means of the plurality of column gates.

The column decoder 25 receives address data from the control unit 20, and selectively drives each column gate of the gate circuit 26 in accordance with the address data, for example. Thereby, the reading and writing of data can be performed on an arbitrary bit line BL.

The page buffer 27 is provided between the sense amplifier circuit 24 and the gate circuit 26. The page buffer 27 temporarily retains write data and read data.

The control unit 20 receives an external control signal such as a write enable signal, a read enable signal, an address latch enable signal, and a command latch enable signal from a host or a memory controller, and controls the overall operation of the memory cell array MA, such as the sequence control of the reading, writing, and erasing of data and the control of the applied voltage.

The voltage generation circuit 21 includes a plurality of boost circuits and a pulse generation circuit, for example. The voltage generation circuit 21 switches the number of boost circuits driven, based on a control signal from the control unit 20; and controls the pulse generation circuit to adjust the pulse width and pulse height of the pulse voltage supplied to the row decoder 22, the sense amplifier circuit 24, the page buffer 27, the gate circuit 26, etc., for example.

Figure 2:
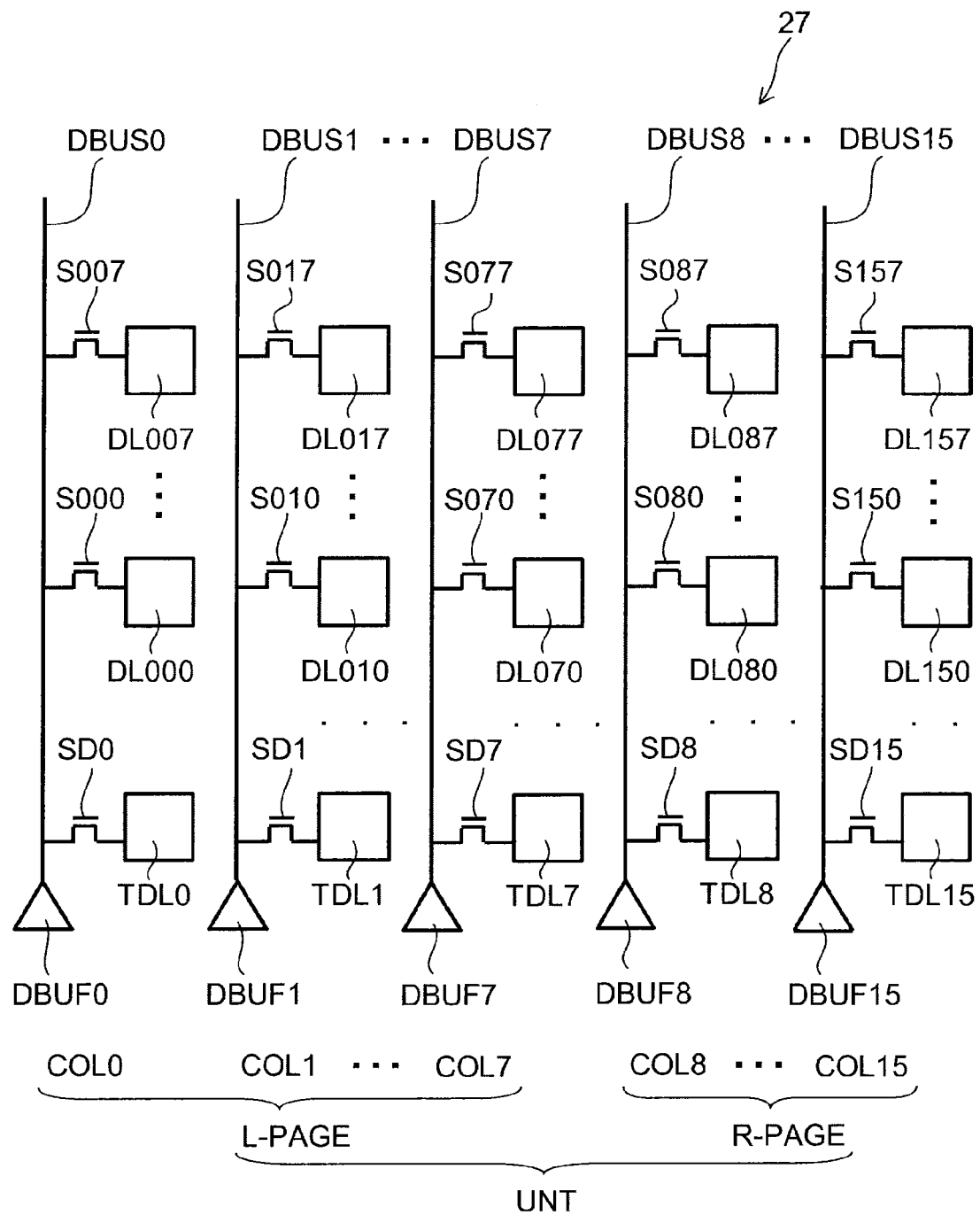
FIG. 2 is a block diagram schematically showing the page buffer of the semiconductor memory device according to the embodiment.

FIG. 2 is a block diagram schematically showing the page buffer of the semiconductor memory device according to the embodiment.

FIG. 2 schematically shows part of the page buffer 27.

As shown in FIG. 2, the page buffer 27 includes a plurality of data busses DBUS0 to DBUS15, a plurality of data buffers DBUF0 to DBUF15, a plurality of data latches DL000 to 007, 010 to 017, 070 to 077, 080 to 087, and 150 to 157, a plurality of temporary latches TDL0 to TDL15, and a plurality of switches S000 to 007, 010 to 017, 070 to 077, 080 to 087, 150 to 157, and SD0 to SD15.

In the following, the data buses DBUS0 to DBUS15 may be collectively referred to as a "data bus DBUS". The data buffers DBUF0 to DBUF15 may be collectively referred to as a "data buffer DBUF". The data buffers DBUF0 to DBUF15 may be collectively referred to as a "data buffer DBUF". The data latches DL000 to 007, 010 to 017, 070 to 077, 080 to 087, and 150 to 157 may be collectively referred to as a "data latch DL". The temporary latches TDL0 to TDL15 may be collectively referred to as a "temporary latch TDL". The switches S000 to 007, 010 to 017, 070 to 077, 080 to 087, and 150 to 157 may be collectively referred to as a "switch S". The switches SD0 to SD15 may be collectively referred to as a "switch SD".

The plurality of data buffers DBUF are connected to the plurality of data buses DBUS. One data bus DBUS is connected to one corresponding data buffer DBUF. The data buffer DBUF outputs, to the data bus DBUS, data inputted from the outside via the data input/output terminal 12, for example. The data buffer DBUF outputs, to the common bus 28, data read from the memory cell transistor MT, for example.

The data bus DBUS is connected to a plurality of sense amplifiers SA. In the case where eight sense amplifiers SA are connected to one data bus DBUS, when the memory cell transistor MT retains data of one bit, then data of eight bits, that is, of one byte are inputted to and outputted from the one data bus DBUS, for example. In this example, one data bus DBUS is connected to eight bit lines BL, and the eight bit lines BL are used as one column, for example. Thus, by the data bus DBUS being shared by a plurality of bit lines BL, the area of the semiconductor memory device 10 (what is called a chip area) can be reduced, for example.

In the following, a description is given by referring to the columns COL0, COL1 . . . COL7, COL8 . . . COL15 corresponding to the data buses DBUS0 to DBUS15 as a column 0 to a column 15. The number of sense amplifiers SA connected to the data bus DBUS is not limited to eight but may be an arbitrary number.

A not-illustrated switch is provided between the data bus DBUS and each sense amplifier SA. Each switch serves to selectively switch the sense amplifier SA connected to the data bus DBUS. The data bus DBUS is selectively connected to one of the eight sense amplifiers SA, for example. The switching of connection between the data bus DBUS and each sense amplifier SA is controlled by the control unit 20, for example.

The data latch DL temporarily retains data to be written on the memory cell transistor MT and data read from the memory cell transistor MT.

The data bus DBUS is connected to a plurality of data latches DL. The data bus DBUS is connected to the same number of data latches DL as the sense amplifiers SA, for example. In this example, eight data latches DL are connected to one data bus DBUS. Thereby, the data of each sense amplifier SA are temporarily retained in each data latch DL.

The number of data latches DL may not necessarily be the same as the number of sense amplifiers SA. For example, in the case where the memory cell transistor MT retains a large number of bits, data latches DL more in number than the sense amplifiers SA by the number of those bits are connected to the data bus DBUS. The number of sense amplifies SA connected to the data bus DBUS and the number of data latches DL connected to the data bus DBUS are not limited to plural but may be one. That is, the data bus DBUS is connected to one or more sense amplifiers SA. The data bus DBUS is connected to one or more data latches DL.

The switch S is provided between the data bus DBUS and each data latch DL. Each switch S serves to selectively switch the data latch DL connected to the data bus DBUS. The data bus DBUS is selectively connected to one of the eight data latches DL. The ON/OFF of the switch S is controlled by the control unit 20, for example.

The temporary latch TDL, during writing, temporarily stores data sent from the data buffer DBUF, and sends the stored data to one of the data latches DL.

The length of the interconnection between the temporary latch TDL and the data buffer DBUF is shorter than the length of the interconnection between the data latch DL and the data buffer DBUF. That is, the temporary latch TDL is disposed nearer to the data buffer DBUF than each data latch DL is. The temporary latch TDL may be what is disposed nearest to the data buffer DBUF out of the plurality of data latches DL connected to one data bus DBUS, or may be disposed immediately adjacent to the same region as the data buffer DBUF, for example. The configuration of the temporary latch TDL may be the same as or different from the configuration of the data latch DL.

The switch SD is provided between the data bus DBUS and the temporary latch TDL. The switch SD serves to selectively switch the connection of the temporary latch TDL to the data bus DBUS. The ON/OFF of the switch SD is controlled by the control unit 20, for example.

The control unit 20 controls the ON/OFF of each switch S and each switch SD during the writing and reading of data on the memory cell transistor MT, for example. Thereby, data can be read and written for an arbitrary bit line BL.

The control unit 20, during the writing of data, performs processing by taking 16 data buses DBUS of the data buses DBUS0 to DBUS15 as one unit structure UNT, for example. In other words, the control unit 20 performs processing by taking 16 columns as one unit structure UNT.

In the following, the portion corresponding to eight data buses DBUS of the data buses DBUS0 to DBUS7 is referred to as an L page. The portion corresponding to eight data buses DBUS of the data buses DBUS8 to DBUS15 is referred to as an R page.

In FIG. 2, only one unit structure UNT is illustrated for the sake of convenience. In actual practice, a plurality of unit structures UNT are provided in the semiconductor memory device 10. The control unit 20 controls the reading and writing of data for each unit structure UNT, for example. The number of data buses DBUS included in one unit structure UNT is not limited to 16 but may be an arbitrary number. In actual practice, 256 columns or 1 k columns constitute the unit structure UNT, for example. ½, ⅛, 1/16, or the like of the total number of columns may be taken as the unit structure UNT, for example.

Figure 3:
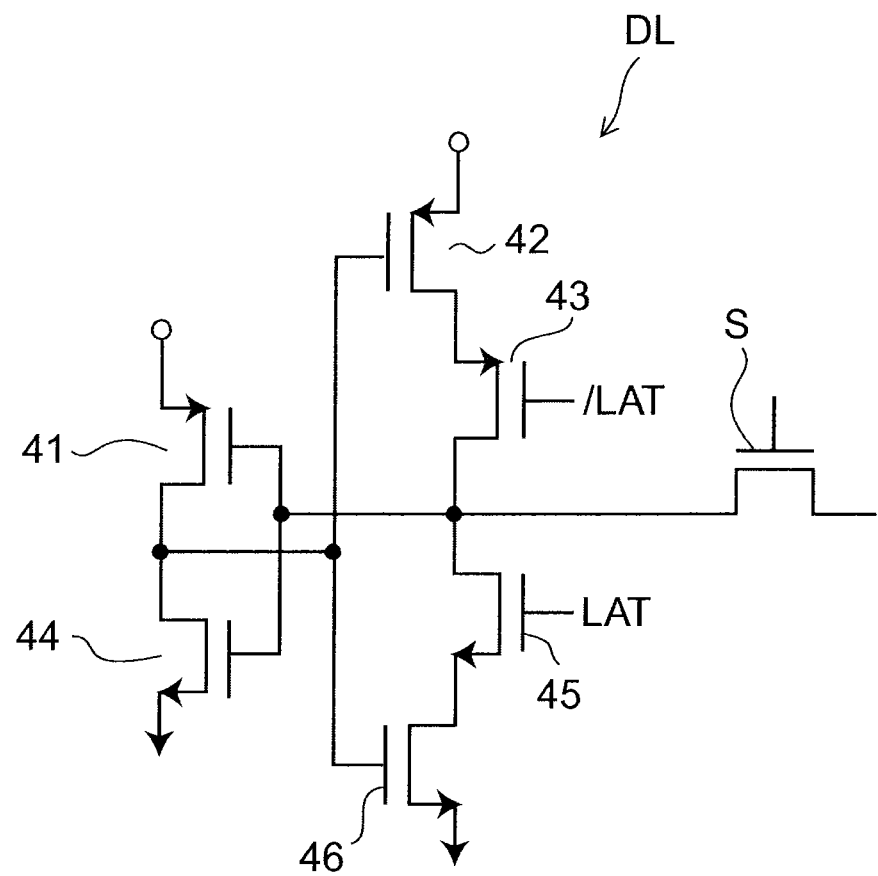
FIG. 3 is a circuit diagram schematically showing an example of the data latch.

FIG. 3 is a circuit diagram schematically showing an example of the data latch.

As shown in FIG. 3, the data latch DL includes three p-channel MOSFETs 41 to 43 and three n-channel MOSFETs 44 to 46, for example.

The sources of the p-channel MOSFETs 41 and 42 are set at the power supply potential. The sources of the n-channel MOSFETs 44 and 46 are connected to the ground. The gate of the n-channel MOSFET 45 gives and receives an LAT signal. The gate of the p-channel MOSFET 43 gives and receives a /LAT signal in which the LAT signal is inverted. The drain of the p-channel MOSFET 43 and the drain of the n-channel MOSFET 45 are connected to the switch S.

When LAT and S are set to LAT=0 and S=1, writing on the data latch DL becomes possible. That is, data inputted via the switch S are retained in the data latch DL.

When LAT and S are set to LAT=1 and S=1, reading from the data latch DL becomes possible. When LAT=1 and S=0, data are retained in the data latch DL.

Figure 4:
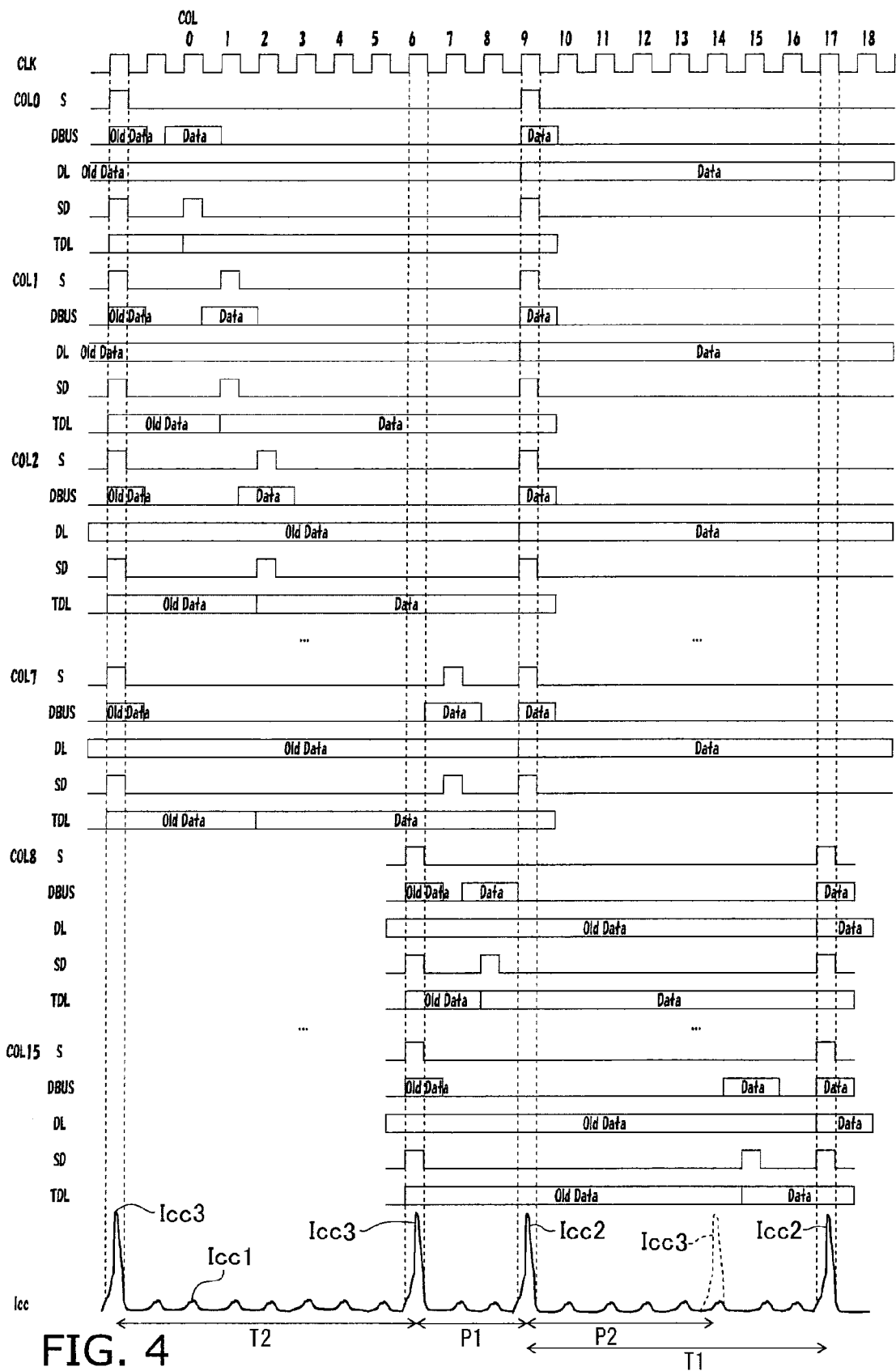
FIG. 4 is a timing chart schematically showing an example of the operation of the control unit.

FIG. 4 is a timing chart schematically showing an example of the operation of the control unit.

Figure 5:
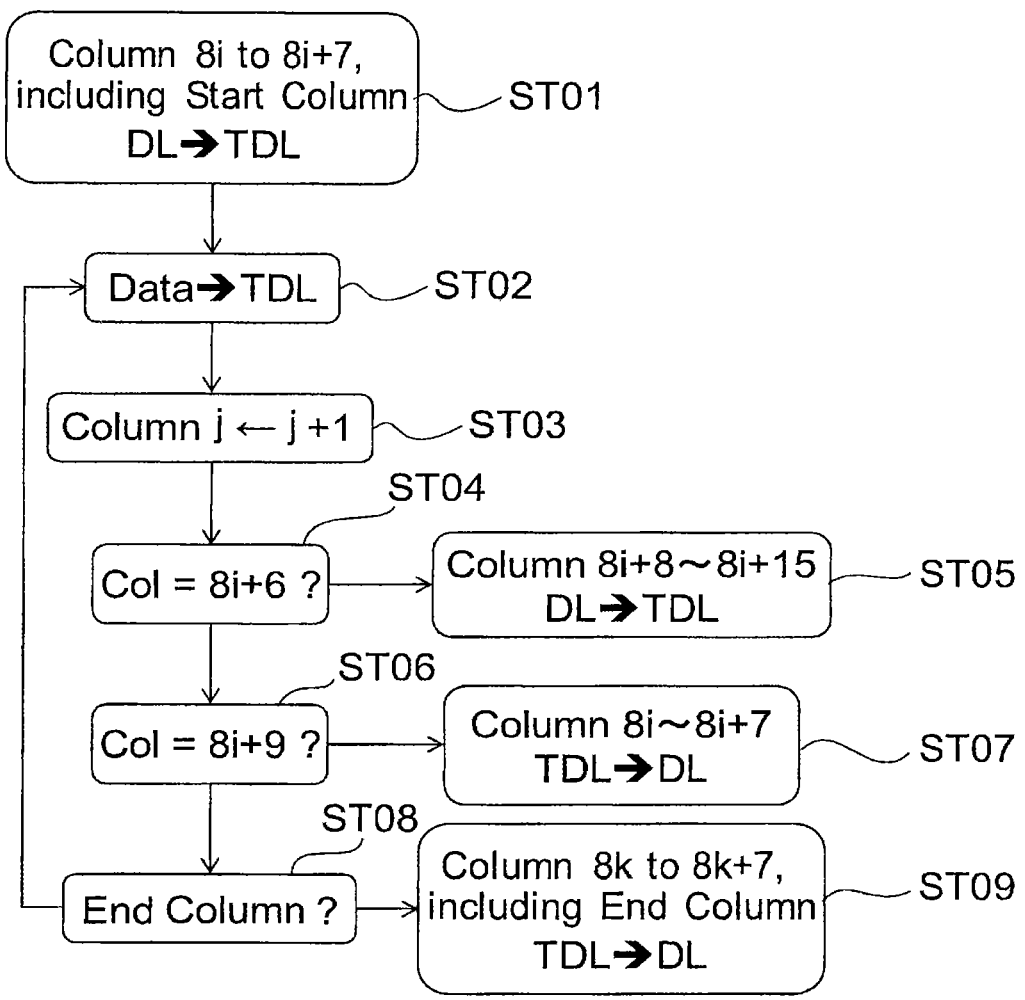
FIG. 5 is a flow chart schematically showing an example of the operation of the control unit.

FIG. 5 is a flow chart schematically showing an example of the operation of the control unit.

FIG. 4 and FIG. 5 schematically show an example of the operation of the control unit 20 when writing is performed on each memory cell transistor MT of an arbitrary page of the memory cell array MA.

In FIG. 4, the number written above a clock signal CLK is the number of the column on which data are written. The clock signals for COL0 to COL18 are shown. In FIG. 5, "i", "j", and "k" are arbitrary numbers of 0 or more. The "i", "j", and "k" correspond to the number of the column on which data are written.

As shown in FIG. 4 and FIG. 5, first, the control unit 20 sets to ON the switches S of the data latches DL of the columns COL0, COL1, COL2 . . . COL7 of the L page out of the data latches DL corresponding to the pages to be written on. Simultaneously with this, the control unit 20 sets to ON the switches SD corresponding to the temporary latches TDL of the L page. Thereby, the control unit 20 transfers data retained in each data latch DL of the L page to each corresponding temporary latch TDL (step ST01 of FIG. 5). That is, the control unit 20 sets column 0 to start column (column 8$i$), and the control unit 20 transfers data retained in each data latch DL of the column 0 to column 7 (column 8$i$+7) to each corresponding temporary latch TDL (Column 8$i$ to 8$i$+7, including Start Column DL→TDL).

The write operation of the control unit 20 is performed in synchronization with a clock signal CLK, for example. In the following, the rising edge of the clock signal CLK is referred to as a "write timing".

The control unit 20 sets the switches S000 to S070 to ON and the switches SD0 to SD7 to ON, and thereby transfers data retained in the data latches DL000 to DL070 to the temporary latches TDL0 to TDL7, for example. Thereby, false writing due to old data remaining in the temporary latch TDL can be suppressed, for example.

In the case where new data are always written on each temporary latch TDL from the outside or the like, the process of transfer from the data latch DL to the temporary latch TDL may be omitted, for example.

After transferring data to each temporary latch TDL, the control unit 20 sets each switch SD to ON sequentially at each write timing. Thereby, the control unit 20 writes new write data inputted from the outside on each temporary latch TDL of the L page sequentially via each data buffer DBUF (step ST02 and step ST03 of FIG. 5).

The control unit 20 writes new data on the temporary latch TDL0 by setting the switch SD0 to ON at a prescribed write timing after transferring data to each temporary latch TDL (Data→TDL), for example. The control unit 20 writes new data on the temporary latch TDL1 by setting the switch SD1 to ON at the next write timing (Column j←j+1). That is, the terms of "Column j←j+1" mean selection of the next column. The control unit 20 performs this operation repeatedly up to the temporary latch TDL7, which is the last temporary latch TDL of the L page.

When performing writing on the temporary latch TDL6 (Column=8$i$+6?), the control unit 20 sets the switch S of each data latch DL of the columns COL8 . . . COL15 of the R page to ON and each corresponding switch SD to ON, and thereby transfers data retained in each data latch DL of the R page to each corresponding temporary latch TDL (Column 8$i$+8~8$i$+15, DL→TDL) (step ST04 and step ST05 of FIG. 5).

That is, the control unit 20 transfers data retained in each data latch DL of the R page to each corresponding temporary latch TDL at the second last write timing before writing on each temporary latch TDL of the R page starts.

The control unit 20 sets the switch SD6 to ON to write new data on the temporary latch TDL6, and sets the switches S080 to S150 and the switches SD8 to SD15 to ON to transfer data retained in the data latches DL080 to DL150 to the temporary latches TDL8 to TDL15, respectively, for example.

After finishing writing up to the temporary latch TDL7, the control unit 20 writes new write data subsequently inputted from the outside on each temporary latch TDL of the R page sequentially via each data buffer DBUF.

When performing writing on the temporary latch TDL9 (Column=8$i$+9?), the control unit 20 sets the switch SD of each temporary latch TDL of the L page to ON and each corresponding switch S to ON, and thereby transfers new data retained in each temporary latch TDL of the L page to each corresponding data latch DL (Column 8$i$~8$i$+7, TDL→DL) (step S06 and step ST07 of FIG. 5).

The control unit 20 writes new data on the temporary latch TDL9, and transfers data retained in the temporary latches TDL000 to DL070 to the data latches DL000 to DL070, respectively, for example. Thereby, new data are retained in the data latches DL000 to DL070.

After finishing writing up to the temporary latch TDL15, the control unit 20 sets the switch SD of each temporary latch TDL of the R page to ON and each corresponding switch S to ON, and thereby transfers new data retained in each temporary latch TDL of the R page to each corresponding data latch DL (step ST08 and step ST09 of FIG. 5). Thereby, new data are retained in each data latch DL of the R page. In the case where writing is not performed up to TDL15 but stops at a TDL on the way (End Column?), also step ST08 of FIG. 5 is completed and the operation of step ST09 is performed (Column 8k to 8k+7, including End Column, TDL→DL). If that column ends in the L page, new data retained in each TDL of the L page are transferred to each corresponding data latch DL; if that column ends in the R page, new data retained in each TDL of the R page are transferred to each corresponding data latch DL.

New data retained in each data latch DL are transferred to the memory cell transistor MT at a prescribed timing. Data are transferred to the memory cell transistor MT via the data bus DBUS, the sense amplifier SA, and the bit line BL, for example. Thereby, writing for one page is performed.

That is, in this example, one of the data latches DL of the L page is a first data latch, one of the data buses DBUS of the L page is a first data bus, one of the temporary latches TDL of the L page is a first temporary latch, and one of the data buffers DBUF of the L page is a first data buffer.

One of the data latches DL of the R page is a second data latch, one of the data buses DBUS of the R page is a second data bus, one of the temporary latches TDL of the R page is a second temporary latch, and one of the data buffers DBUF of the R page is a second data buffer. In the case where writing on the next page is continuously performed, when performing writing on the temporary latch TDL14, the control unit 20 sets the switch S of each data latch DL of the L page of the next page to ON and each corresponding switch SD to ON, and thereby transfers data retained in each data latch DL of the L page of the next page to each corresponding temporary latch TDL, for example.

The control unit 20 sets the switches S001 to S071 to ON and the switches SD0 to SD7 to ON, and thereby transfers data retained in the data latches DL001 to DL071 to the temporary latches TDL0 to TDL7, respectively, for example.

By repeating similar processing after that, writing can be continuously performed on a plurality of pages.

In the case where 16 or more columns are included in the unit structure UNT, when writing is performed on the temporary latch TDL14, data retained in the data latches DL for the next eight columns may be transferred to the corresponding temporary latches TDL, for example.

There is a semiconductor memory device in which the temporary latch TDL is not provided and data outputted from the data buffer DBUF are directly written on the data latch DL, for example. In the semiconductor memory device, with miniaturization, the length of the data bus DBUS is becoming longer, the L/S of the interconnection is becoming smaller, and the interconnect delay of the data bus DBUS is becoming larger. Thus, in the semiconductor memory device, the whole chip is separated into some sections, and access is made in a parallel manner; thereby, high speed operation is achieved using interleave operation in which the transfer of internal data is made slower or the like. However, in face of requirements for higher speed, it is becoming difficult to achieve such requirements.

Thus, if the interconnection is made long and thin, RC delay is increased to interfere with achieving high speed. In view of this, it is desired for the semiconductor memory device to enable writing at higher speed even if the interconnection is made long and thin.

In contrast, in the semiconductor memory device 10 according to the embodiment, data inputted from the outside are temporarily retained in the temporary latch TDL via the data buffer DBUF. The length of the interconnection between the temporary latch TDL and the data buffer DBUF is shorter than the length of the interconnection between the data latch DL and the data buffer DBUF. Therefore, the time of writing data on the temporary latch TDL is shorter than the time of writing data on the data latch DL. That is, in the case where data are written on the temporary latch TDL, writing can be performed at high speed as compared to the case where data are written on the data latch DL.

When writing is performed on the temporary latch TDL of the R page, data retained in the temporary latch TDL of the L page are transferred to the corresponding data latch DL of the L page, for example. Thereby, writing can be performed on the data latch DL in a sufficient time.

In the case of a system in which data are directly written on the data latch DL, the time of writing on the data latches DL007 to DL157 is longer than the time of writing on the data latches DL000 to DL150 due to the difference in interconnection length, for example. Thus, the device needs to be designed in accordance with the write time of the data latches DL007 to DL157, and this interferes with achieving high speed.

On the other hand, in the semiconductor memory device according to the embodiment, even when writing is performed on the data latches DL007 to DL157, writing can be performed in a time substantially equal to that when writing is performed on the data latches DL000 to DL150, for example.

Thus, in the semiconductor memory device 10 according to the embodiment, writing can be performed at higher speed. Both miniaturization and higher speed can be achieved, for example.

As shown in FIG. 4, during writing, the control unit 20 passes a first consumption current Icc1 and passes a second consumption current Icc2 larger than the first consumption current Icc1 periodically. The first consumption current Icc1 is the consumption current flowing through the device when new data are written on the temporary latch TDL. The second consumption current Icc2 is the consumption current flowing through the device when data retained in the temporary latch TDL are transferred to the data latch DL.

In the semiconductor memory device 10 according to the embodiment, when data retained in the temporary latch TDL are transferred to the data latch DL, a plurality of switches S and a plurality of switches SD are set to ON simultaneously. Therefore, the second consumption current Icc2 flowing through the device when data retained in the temporary latch TDL are transferred to the data latch DL is larger than the first consumption current Icc1 flowing through the device when new data are written on the temporary latch TDL. The second consumption current Icc2 is 1.5 times or more the first consumption current Icc1, for example. The consumption current is the current flowing through the entire semiconductor memory device 10 (power supply current), for example.

In the case of a system in which data are directly written on the data latch DL, a current substantially equal to the first consumption current Icc1 flows repeatedly during writing, for example. Hence, an event in which the second consumption current Icc2 larger than the first consumption current Icc1 has flowed periodically during writing can be regarded as performing substantially the same processing as that of the semiconductor memory device 10 according to the embodiment.

In the semiconductor memory device 10, also when old data retained in the data latch DL are transferred to the temporary latch TDL, a plurality of switches S and a plurality of switches SD are set to ON simultaneously. Therefore, also a third consumption current Icc3 flowing through the device when data retained in the data latch DL are transferred to the temporary latch TDL is larger than the first consumption current Icc1 flowing through the device when new data are written on the temporary latch TDL, similarly to the second consumption current Icc2. The third consumption current Icc3 is 1.5 times or more the first consumption current Icc1, for example. Thus, the control unit 20 further passes the third consumption current Icc3 larger than the first consumption current Icc1 periodically during writing.

The interval P1 between the second consumption current Icc2 and the third consumption current Icc3 is different from the period T1 of the second consumption current Icc2 and the period T2 of the third consumption current Icc3.

Thus, in the semiconductor memory device 10, a large consumption current flows periodically with three different periods of the periods T1 and T2 and the interval P1, for example.

As described above, in the case where writing on the next page is continuously performed, the control unit 20 transfers data retained in each data latch DL of the L page of the next page to each corresponding temporary latch TDL when performing writing on the temporary latch TDL14, for example. Therefore, as shown by the broken line in FIG. 4, when writing on the next page is performed, the third consumption current Icc3 flows at the timing of performing writing on the temporary latch TDL14.

At this time, the interval between the second consumption current Icc2 and the next third consumption current Icc3 is P2. The interval P2 is different from the interval P1, for example. Thus, in the case where writing is continuously performed, the second consumption current Icc2 and the third consumption current Icc3 flow periodically at two intervals of the interval P1 and the interval P2.

Also in the case where writing is continuously performed on different memory cells of the same page, the second consumption current Icc2 and the third consumption current Icc3 similarly flow periodically at the intervals P1 and P2, for example.

The second consumption current Icc2 and the third consumption current Icc3 may be seen to overlap into one peak, depending on the timing.

Figure 6:
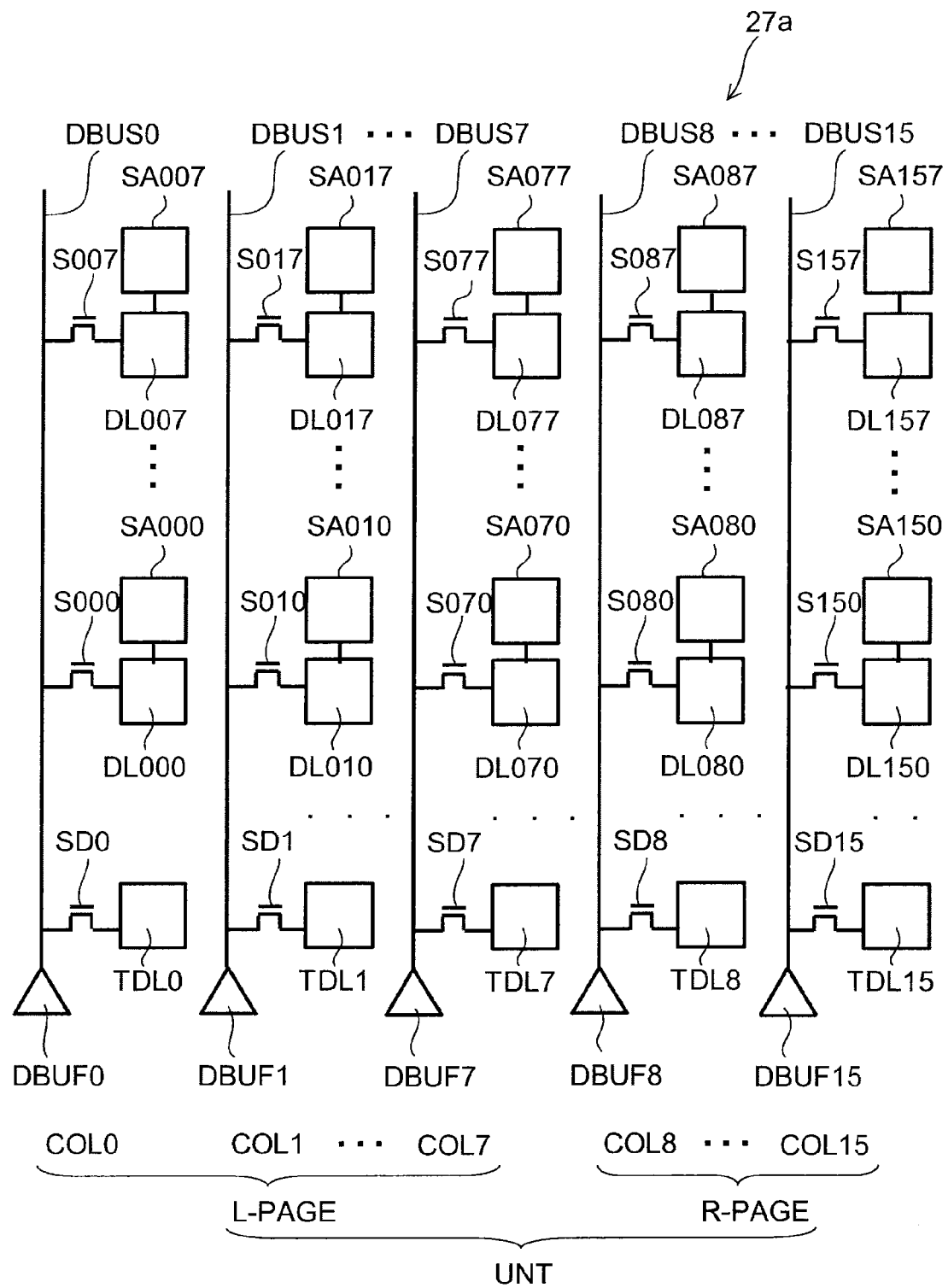
FIG. 6 is a block diagram schematically showing another page buffer of the semiconductor memory device according to the embodiment.

FIG. 6 is a block diagram schematically showing another page buffer of the semiconductor memory device according to the embodiment.

As shown in FIG. 6, a page buffer 27a includes a plurality of sense amplifiers SA. The plurality of sense amplifiers SA are connected to a plurality of data latches DL. The page buffer 27a is one unit composed of the sense amplifier circuit 24 and the page buffer 27 of the embodiment described above.

The sense amplifier circuit 24 and the page buffer 27 shown in FIG. 1 consume a large current because the data line connecting them is long. Thus, as shown in FIG. 6, the sense amplifier circuit 24 and the page buffer 27 are made into one unit. Thereby, the consumption current of data transfer between the sense amplifier circuit 24 and the page buffer 27 can be reduced.

In this case, the length between the data bus DBUS and the data buffer DBUF becomes longer, and the write speed from the data buffer DBUF to the data latch DL becomes slower.

Even in such a circuit configuration, high speed writing is enabled by providing the temporary latch TDL.

Figure 7:
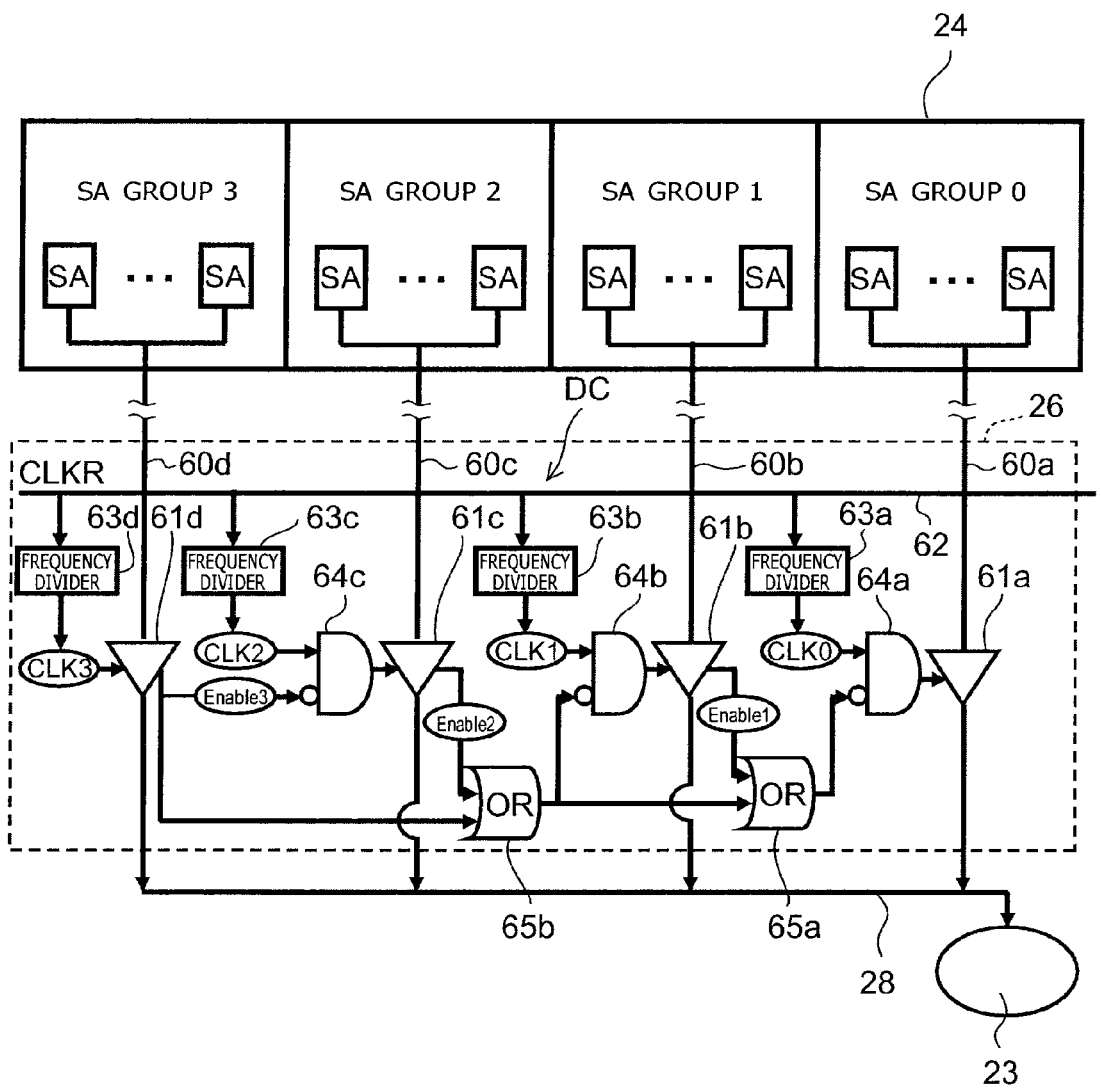
FIG. 7 is a block diagram schematically showing an example of the gate circuit.

FIG. 7 is a block diagram schematically showing an example of the gate circuit.

As shown in FIG. 7, the gate circuit 26 includes four data lines 60a to 60d (hereinafter, occasionally collectively referred to as a "data line 60"), four column gates 61a to 61d (hereinafter, occasionally collectively referred to as a "column gate 61"), a clock signal line 62, four frequency dividers 63a to 63d, and a drive circuit DC. The drive circuit DC includes three AND circuits 64a to 64c and two OR circuits 65a and 65b, for example.

The semiconductor memory device 10 divides the plurality of sense amplifiers SA provided in the sense amplifier circuit 24 into a plurality of groups. In this example, the plurality of sense amplifiers SA are divided into four groups of SA group 0 to SA group 3.

The gate circuit 26 outputs data from SA group 0 to SA group 3 one after another. Thereby, the processing speed of the interior can be relaxed. The number of groups dividing the sense amplifiers SA is not limited to four but may be any number of two or more.

The data line 60a is connected to each sense amplifier SA of SA group 0. The data line 60b is connected to each sense amplifier SA of SA group 1. The data line 60c is connected to each sense amplifier SA of SA group 2. The data line 60d is connected to each sense amplifier SA of SA group 3. The data lines 60a to 60d are each connected to each sense amplifier SA of one group via each data bus DBUS of the page buffer 27, for example.

The column gate 61 is provided between the data line 60 and the common bus 28. The column gate 61 has the function of switching the electrical connection between the data line 60 and the common bus 28. The column gate 61 switches the conduction state and the cut-off state of the data line 60 and the common bus 28.

Thus, the data lines 60a to 60d connected to the common bus 28 are selectively switched by the column gates 61a to 61d. The "cut-off state" is a state where substantially no current flows between the data line 60 and the common bus 28, for example. In other words, in the cut-off state, a small current that substantially does not influence the operation of the semiconductor memory device 10 may flow.

The clock signal line 62 supplies a clock signal CLKR. The clock signal line 62 is connected to the voltage generation circuit 21, for example. The clock signal CLKR generated by the voltage generation circuit 21 is supplied to the gate circuit 26 via the clock signal line 62, for example.

The frequency dividers 63a to 63d generate clock signals CLK0 to CLK3 frequency-divided from the clock signal CLKR supplied from the clock signal line 62 (frequency-divided signals).

The frequency divider 63a inputs the generated clock signal CLK0 to the AND circuit 64a.

The frequency divider 63b inputs the generated clock signal CLK1 to the AND circuit 64b.

The frequency divider 63c inputs the generated clock signal CLK2 to the AND circuit 64c.

The frequency divider 63d inputs the generated clock signal CLK3 to the column gate 61d.

The column gate 61d becomes the conduction state when the clock signal CLK3 is Hi, and becomes the cut-off state when the clock signal CLK3 is Lo, for example.

The frequency dividers 63a to 63d frequency-divide the clock signal CLKR into ¼ period. The frequency dividers 63a to 63d generate signals each outputted once in four times at different timings out of the pulse of the clock signal CLKR, as a clock signal CLK0 to a clock signal CLK3.

That is, the frequency dividers 63a to 63d operate such that a pulse is outputted from CLK0 at a certain timing, another pulse is outputted from CLK1, yet another pulse is outputted from CLK2, and yet another pulse is outputted from CLK3, for example.

The column gate 61d is further connected to the other input terminal of the AND circuit 64c and one input terminal of the OR circuit 65b.

The column gate 61d inputs an Enable 3 signal to the AND circuit 64c and the OR circuit 65b. The Enable 3 signal becomes Hi when the column gate 61d is set to the conduction state, and becomes Lo when the column gate 61d is set to the cut-off state, for example.

An inverter is provided at the other input terminal of the AND circuit 64c, and the Enable 3 signal is inverted at the other input terminal of the AND circuit 64c.

The column gate 61c is further connected to the other input terminal of the OR circuit 65b. The column gate 61c inputs an Enable 2 signal to the OR circuit 65b. The Enable 2 signal becomes Hi when the column gate 61c is set to the conduction state, and becomes Lo when the column gate 61c is set to the cut-off state, for example.

The column gate 61b is further connected to one input terminal of the OR circuit 65a. The column gate 61b inputs an Enable 1 signal to the OR circuit 65a. The Enable 1 signal becomes Hi when the column gate 61b is set to the conduction state, and becomes Lo when the column gate 61b is set to the cut-off state, for example.

The output of the AND circuit 64c is inputted to the column gate 61c.

The column gate 61c becomes the conduction state when the output of the AND circuit 64c is Hi, and becomes the cut-off state when the output of the AND circuit 64c is Lo, for example.

The output of the OR circuit 65b is inputted to the other input terminal of the AND circuit 64b and the other input terminal of the OR circuit 65a. An inverter is provided at the other input terminal of the AND circuit 64b, and the output of the OR circuit 65b is inverted at the other input terminal of the AND circuit 64b.

The output of the AND circuit 64b is inputted to the column gate 61b.

The column gate 61b becomes the conduction state when the output of the AND circuit 64b is Hi, and becomes the cut-off state when the output of the AND circuit 64b is Lo, for example.

The output of the OR circuit 65a is inputted to the other input terminal of the AND circuit 64a. An inverter is provided at the other input terminal of the AND circuit 64a, and the output of the OR circuit 65a is inverted at the other input terminal of the AND circuit 64a.

The output of the AND circuit 64a is inputted to the column gate 61a.

The column gate 61a becomes the conduction state when the output of the AND circuit 64a is Hi, and becomes the cut-off state when the output of the AND circuit 64a is Lo, for example.

Figure 8:
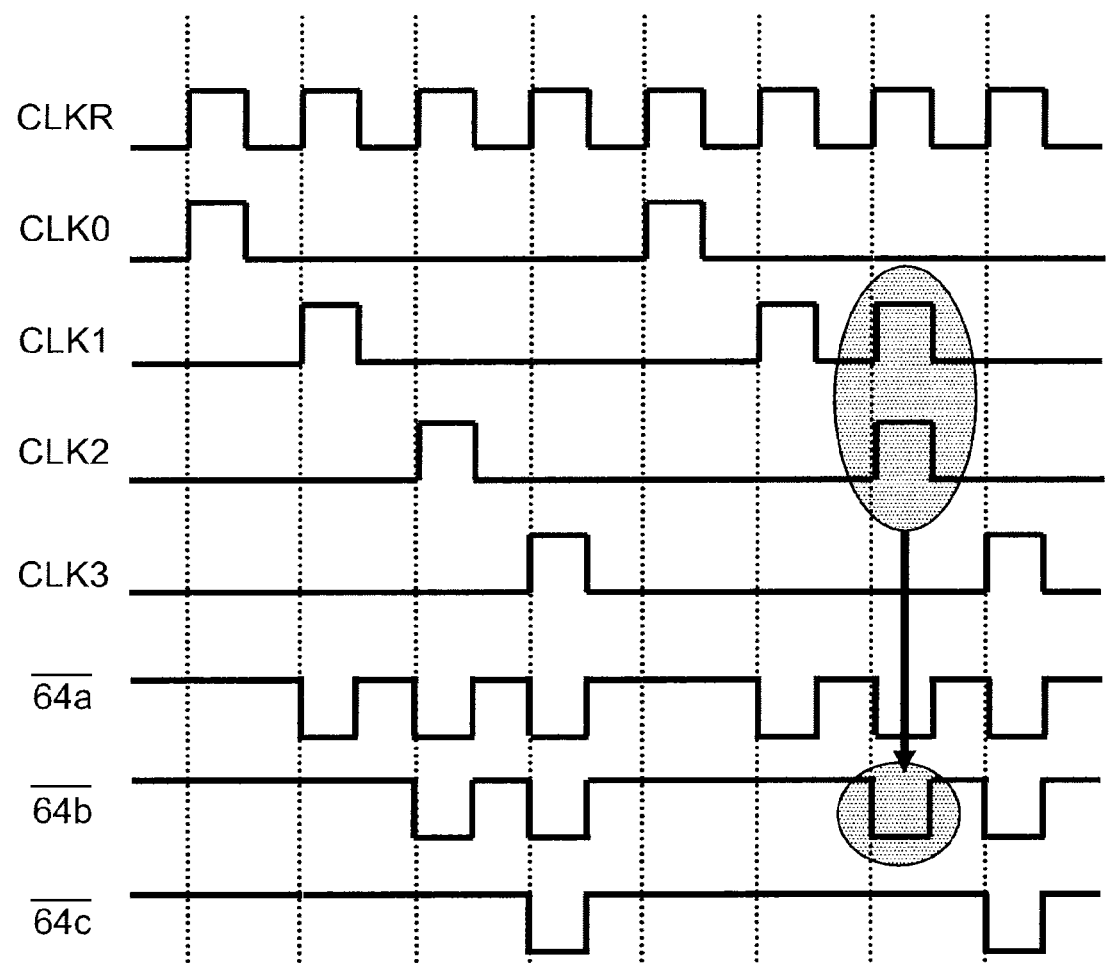
FIG. 8 is a timing chart schematically showing an example of the operation of the gate circuit.

FIG. 8 is a timing chart schematically showing an example of the operation of the gate circuit.

FIG. 8 schematically shows an example of the read operation of the semiconductor memory device 10.

As shown in FIG. 8, in the gate circuit 26, in the reading operation the clock signals CLK0 to CLK3 are generated from the clock signal CLKR by the frequency dividers 63a to 63d.

When the clock signal CLK3 has become Hi, the column gate 61d becomes the conduction state, and data read by one sense amplifier SA included in SA group 3 are outputted to the data input/output buffer 23 via the common bus 28.

When the column gate 61d has become the conduction state, the inverted signal of the Enable 3 signal inputted to the AND circuit 64c becomes Lo. Accordingly, in this state, the output of the AND circuit 64c becomes Lo. Consequently, in this state, the column gate 61c is kept in the cut-off state.

When the column gate 61d has become the conduction state, Hi is inputted to the OR circuit 65b. Accordingly, the output of the OR circuit 65b becomes Hi, and one input of the AND circuit 64b becomes Lo. Consequently, the output of the AND circuit 64b becomes Lo, and also the column gate 61b is kept in the cut-off state.

When the output of the OR circuit 65b has become Hi, Hi is inputted to the OR circuit 65a. Accordingly, also the output of the OR circuit 65a becomes Hi, and one input of the AND circuit 64a becomes Lo. Consequently, also the output of the AND circuit 64a becomes Lo, and also the column gate 61a is kept in the cut-off state.

The AND circuit 64c outputs Hi when the clock signal CLK2 is Hi and also the inverted signal of the Enable 3 signal is Hi (when the column gate 61d is in the cut-off state).

Thereby, the column gate 61c becomes the conduction state, and data read by one sense amplifier SA included in SA group 2 are outputted to the data input/output buffer 23 via the common bus 28.

When the column gate 61c has become the conduction state, the Enable 2 signal inputted to the OR circuit 65b becomes Hi. Consequently, the output of the OR circuit 65b becomes Hi, and the column gate 61a and the column gate 61b are kept in the cut-off state similarly to the above.

The AND circuit 64b outputs Hi when the clock signal CLK1 is Hi and the column gates 61c and 61d are in the cut-off state.

Thereby, the column gate 61b becomes the conduction state, and data read by one sense amplifier SA included in SA group 1 are outputted to the data input/output buffer 23 via the common bus 28.

When the column gate 61b has become the conduction state, the Enable 1 signal inputted to the OR circuit 65a becomes Hi. Consequently, the output of the OR circuit 65a becomes Hi, and the column gate 61a is kept in the cut-off state similarly to the above.

The AND circuit 64a outputs Hi when the clock signal CLK0 is Hi and the column gates 61b to 61d are in the cut-off state.

Thereby, the column gate 61a becomes the conduction state, and data read by one sense amplifier SA included in SA group 0 are outputted to the data input/output buffer 23 via the common bus 28.

Thus, in the gate circuit 26, the connection of the data lines 60a to 60d to SA group 0 to SA group 3 divided is branched using clock signals. The drive circuit DC switches the plurality of column gates 61a to 61d to the conduction state or the cut-off state on the basis of the clock signal CLKR. Thereby, increasing operating speed and reducing current can be achieved, for example.

In the gate circuit 26, when the column gate 61d has become the conduction state, each of the other column gates 61a to 61c is kept in the cut-off state. When the column gate 61c has become the conduction state, each of the column gates 61a and 61b is kept in the cut-off state. When the column gate 61b has become the conduction state, the column gate 61a is kept in the cut-off state.

That is, in the gate circuit 26, the column gates 61a to 61d becoming the conduction state simultaneously is suppressed.

The drive circuit DC provides each of the plurality of data lines 60a to 60d with a priority rank to suppress simultaneous connection of the plurality of data lines 60a to 60d to the common bus 28. For example, when a situation where the column gates 61a to 61d become the conduction state simultaneously has occurred, a data line of a high priority rank is set to the conduction state.

In this example, the priority rank of the data line 60d is highest, and the priority rank is decreased in the order of the data line 60c, the data line 60b, and the data line 60a. That is, in this example, the drive circuit DC sets higher the priority rank of a data line that is switched to the conduction state at a later timing.

As shown in FIG. 8, it is assumed that the clock signal CLK1 and the clock signal CLK2 have become Hi simultaneously, for example. Also in this case, since the inverter input of the AND circuit 64b is Lo, only the data line 60c is connected to the common bus 28. Simultaneous connection of the data line 60b and the data line 60c to the common bus 28 is suppressed.

Thus, when timings of setting the column gates 61a to 61d to the conduction state have overlapped in a plurality of frequency-divided signals (when pulses have become Hi simultaneously), the drive circuit DC sets to the conduction state one of the column gates 61a to 61d of the data lines 60a to 60d which has a high priority rank.

There is a semiconductor memory device in which a frequency-divided clock signal is inputted to each of the plurality of column gates and each column gate is connected to the common bus in synchronization with the clock signal, for example.

That is, there is a semiconductor memory device in which each of the plurality of column gates has a similar configuration to the column gate 61d mentioned above.

In such a semiconductor memory device, when a shorter pulse is inputted due to increased speed of chip operation or steep power-off, the cycle control of the clock may be broken in the frequency divider circuit of the clock that controls the gate circuit, and pulses may overlap in a plurality of clock signals after frequency division, for example.

If pulses of the clock signal overlap, a plurality of column gates become the conduction state simultaneously. Consequently, a plurality of data lines are connected to the common bus simultaneously, and the transition states of data overlap in the common bus.

There is also a case where not only the overlapping of data in the common bus but also a through current occur. That is, an excessively large current may flow through the common bus due to simultaneous connection of a plurality of data lines to the common bus. The occurrence of a through current leads to a state where a reset command cannot be inputted due to a drop of the internal power source and the power source should be shut down, for example.

Thus, it is desired for the semiconductor memory device to have the capability to suppress the occurrence of a through current with a simple circuit.

In contrast, in the semiconductor memory device 10 according to the embodiment, the drive circuit DC provides each of the data lines 60a to 60d with a priority rank, and sets a data line of a high priority rank to the conduction state when a situation where the column gates 61a to 61d become the conduction state simultaneously has occurred.

Thereby, in the semiconductor memory device 10, the column gates 61a to 61d becoming the conduction state simultaneously can be suppressed. That is, simultaneous connection of the plurality of data lines 60a to 60d to the common bus 28 can be suppressed.

Therefore, in the semiconductor memory device 10, the overlapping of data in the common bus 28 and the occurrence of a through current can be suppressed. In the semiconductor memory device 10, it is necessary only to add the AND circuits 64a to 64c, the OR circuits 65a and 65b, and interconnections for connecting them. Therefore, in the semiconductor memory device 10, the complication of the circuit can be suppressed even when the overlapping of data and the occurrence of a through current are suppressed.

Figure 9:
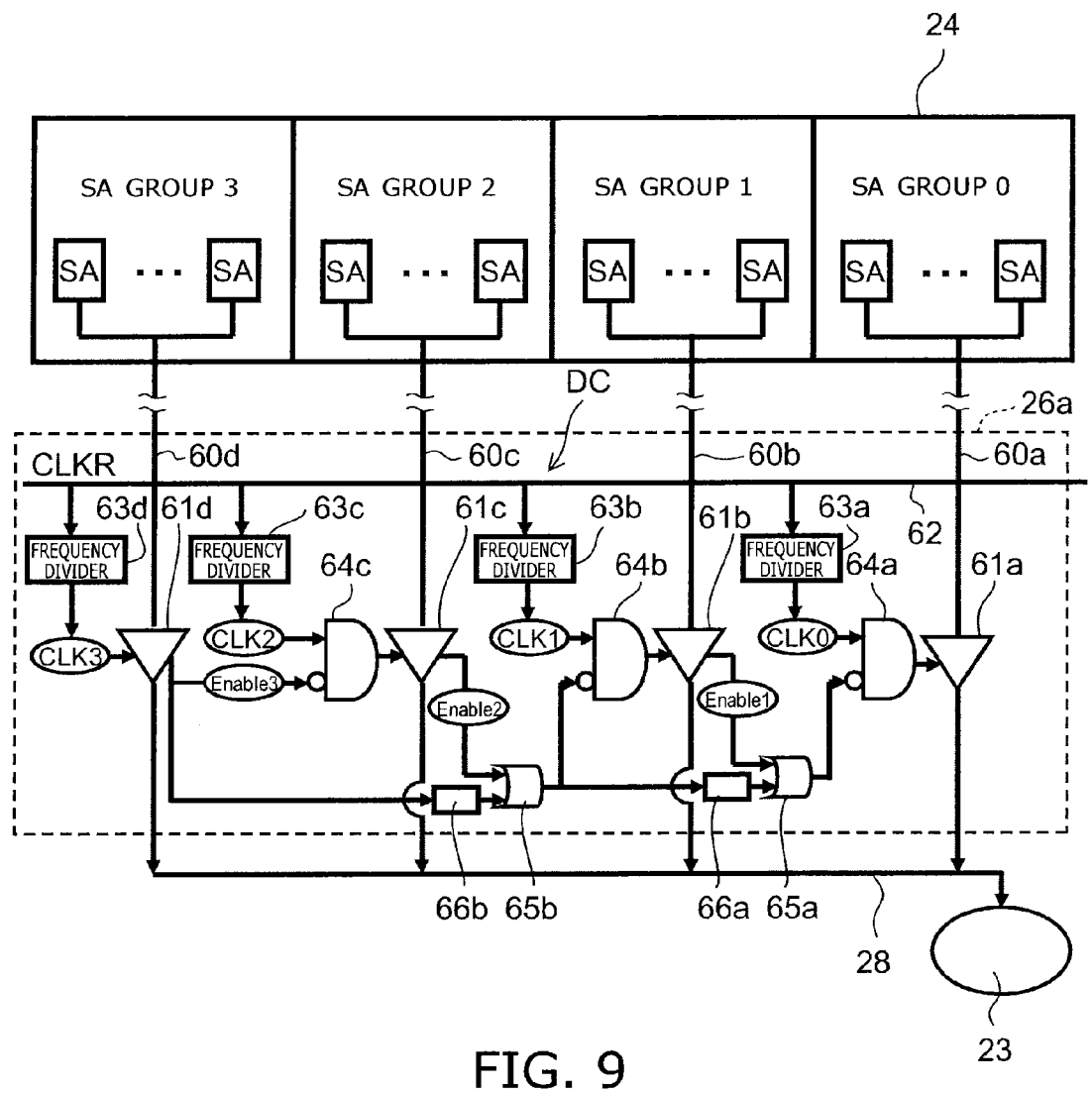
FIG. 9 is a block diagram schematically showing another example of the gate circuit.

FIG. 9 is a block diagram schematically showing another example of the gate circuit.

As shown in FIG. 9, the drive circuit DC of a gate circuit 26a further includes delay circuits 66a and 66b.

The delay circuit 66a is provided between the input terminal of the OR circuit 65a and the output terminal of the OR circuit 65b. The delay circuit 66a adjusts the timing of input to the OR circuit 65a of the Enable 1 signal from the column gate 61b and the output signal of the OR circuit 65b, for example.

The delay circuit 66b is provided between the input terminal of the OR circuit 65b and the column gate 61d. The delay circuit 66b adjusts the timing of input to the OR circuit 65b of the Enable 2 signal from the column gate 61c and the Enable 3 signal from the column gate 61d, for example.

Thereby, in the gate circuit 26a, the column gates 61a to 61d becoming the conduction state simultaneously can be suppressed more properly, for example.

Figure 10:
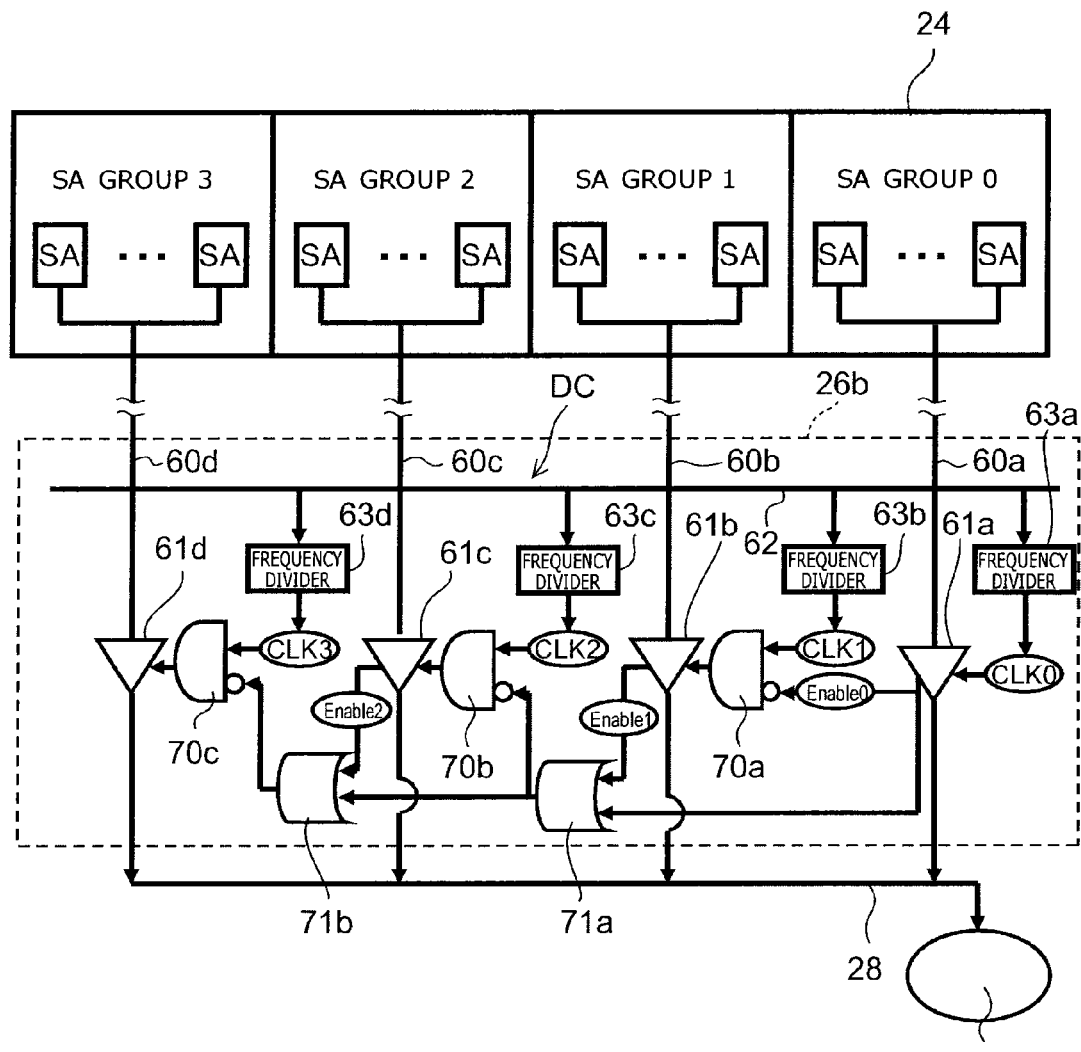
FIG. 10 is a block diagram schematically showing another example of the gate circuit.

FIG. 10 is a block diagram schematically showing another example of the gate circuit.

As shown in FIG. 10, in the drive circuit DC of a gate circuit 26b, AND circuits 70a to 70c and OR circuits 71a and 71b are provided in place of the AND circuits 64a to 64c and the OR circuits 65a and 65b of the gate circuit 26 mentioned above.

The gate circuit 26b is a circuit in which the connection of the AND circuits 70a to 70c and the OR circuits 71a and 71b is inverted with respect to the connection of the AND circuits 64a to 64c and the OR circuits 65a and 65b of the gate circuit 26.

That is, in the gate circuit 26b, the drive circuit DC sets the priority order such that the priority rank of the data line 60a is highest and the priority rank decreases in the order of the data line 60b, the data line 60c, and the data line 60d. In this example, the drive circuit DC sets higher the priority rank of a data line that is switched to the conduction state at an earlier timing.

Also in the gate circuit 26b, the column gates 61a to 61d becoming the conduction state simultaneously can be suppressed. Simultaneous connection of the plurality of data lines 60a to 60d to the common bus 28 can be suppressed. The overlapping of data in the common bus 28 and the occurrence of a through current can be suppressed, for example. Also the complication of the circuit can be suppressed.

Figure 11:
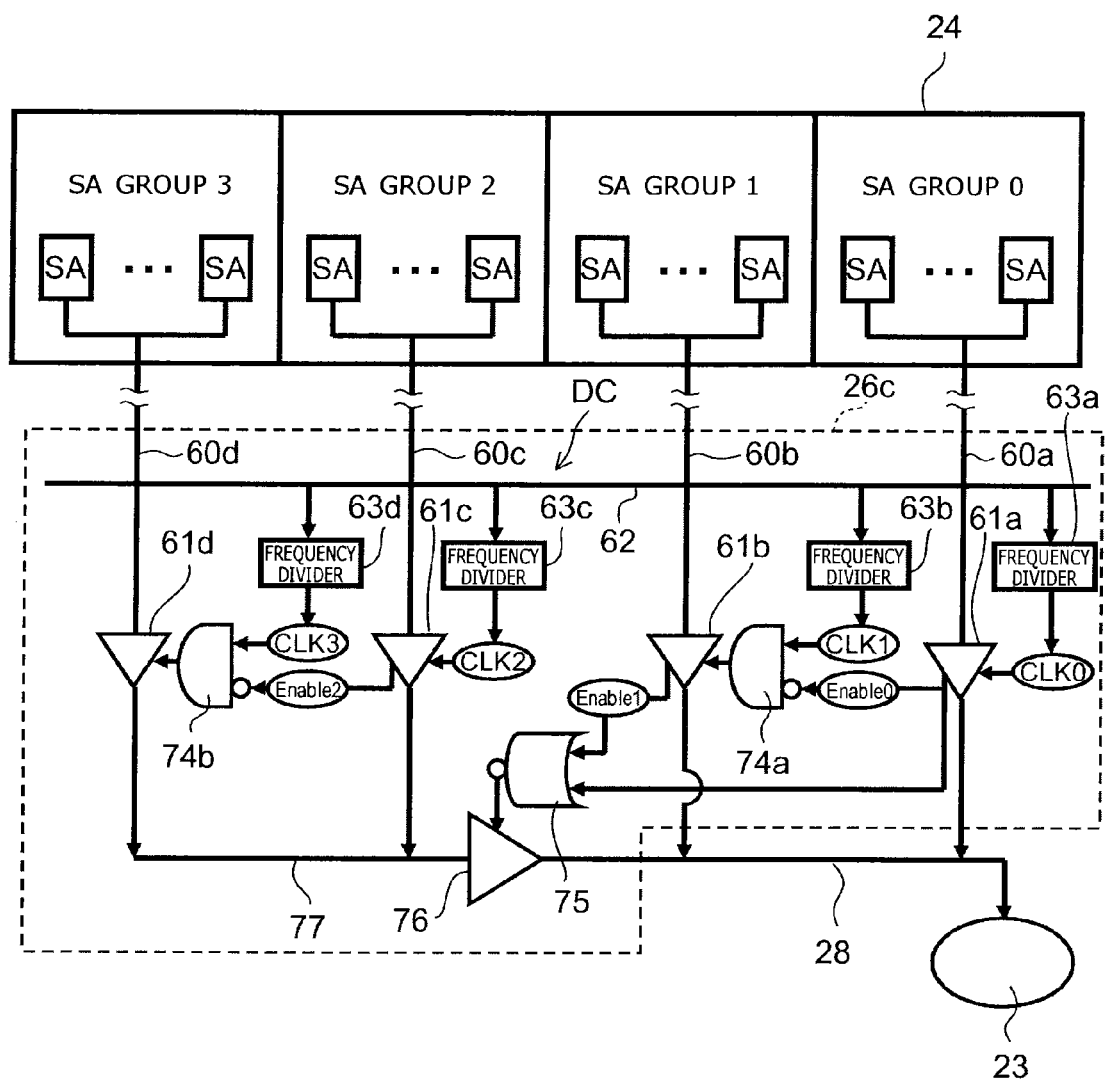
FIG. 11 is a block diagram schematically showing another example of the gate circuit.

FIG. 11 is a block diagram schematically showing another example of the gate circuit.

As shown in FIG. 11, the drive circuit DC of a gate circuit 26c includes AND circuits 74a and 74b, a NOR circuit 75, a control gate 76, and a bus 77.

In the gate circuit 26c, the clock signal CLK0 generated by the frequency divider 63a is inputted to the column gate 61a.

The column gate 61a becomes the conduction state when the clock signal CLK0 is set to Hi, and becomes the cut-off state when the clock signal CLK0 is set to Lo, for example.

The column gate 61a inputs an Enable 0 signal to the AND circuit 74a and the NOR circuit 75. The Enable 0 signal becomes Hi when the column gate 61a is set to the conduction state, and becomes Lo when the column gate 61a is set to the cut-off state, for example.

An inverter is provided at one input terminal of the AND circuit 74a. Thereby, the Enable 0 signal is inverted at the one input terminal of the AND circuit 74a.

The frequency divider 63b inputs the clock signal CLK1 to the other input terminal of the AND circuit 74a.

The output of the AND circuit 74a is inputted to the column gate 61b.

The column gate 61b becomes the conduction state when the output of the AND circuit 74a is set to Hi, and becomes the cut-off state when the output of the AND circuit 74a is set to Lo, for example.

The column gate 61b inputs the Enable 1 signal to the NOR circuit 75. The Enable 1 signal becomes Hi when the column gate 61b is set to the conduction state, and becomes Lo when the column gate 61b is set to the cut-off state, for example.

The output of the NOR circuit 75 is inputted to the control gate 76.

The control gate 76 is provided between the common bus 28 and the bus 77. The control gate 76 becomes the conduction state when the output of the NOR circuit 75 is set to Hi, and becomes the cut-off state when the output of the NOR circuit 75 is set to Lo, for example. By setting the control gate 76 to the conduction state, the bus 77 is connected to the common bus 28.

The frequency divider 63c inputs the clock signal CLK2 to the column gate 61c.

The column gate 61c becomes the conduction state when the clock signal CLK2 is set to Hi, and becomes the cut-off state when the clock signal CLK2 is set to Lo, for example.

The column gate 61c inputs the Enable 2 signal to the AND circuit 74b. The Enable 2 signal becomes Hi when the column gate 61c is set to the conduction state, and becomes Lo when the column gate 61c is set to the cut-off state, for example.

The AND circuit 74b includes an inverter at its one input terminal. Thereby, the Enable 2 signal is inverted at the one input terminal of the AND circuit 74b.

The frequency divider 63d inputs the clock signal CLK3 to the other input terminal of the AND circuit 74b.

The output of the AND circuit 74b is inputted to the column gate 61d.

The column gate 61d becomes the conduction state when the output of the AND circuit 74b is set to Hi, and becomes the cut-off state when the output of the AND circuit 74b is set to Lo, for example.

The column gates 61c and 61d are connected to the bus 77. By setting the column gate 61c to the conduction state, the data line 60c is connected to the bus 77. By setting the column gate 61d to the conduction state, the data line 60d is connected to the bus 77.

In the gate circuit 26c, when the clock signal CLK0 is set to Hi, the column gate 61a becomes the conduction state, and data read by one sense amplifier SA included in SA group 0 are outputted to the data input/output buffer 23 via the common bus 28.

When the column gate 61a has become the conduction state, the inverted signal of the Enable 0 signal inputted to the AND circuit 74a becomes Lo. Accordingly, in this state, the output of the AND circuit 74a becomes Lo. Consequently, in this state, the column gate 61b is kept in the cut-off state.

When the column gate 61a has become the conduction sate, Hi is inputted to the NOR circuit 75. Accordingly, the output of the NOR circuit 75 becomes Hi, and the control gate 76 is kept in the cut-off state. Therefore, when the column gate 61a has become the conduction state, the connection of the data lines 60c and 60d to the common bus 28 is suppressed.

The AND circuit 74a outputs Hi when the clock signal CLK1 is Hi and also the inverted signal of the Enable 0 signal is Hi (when the column gate 61a is in the cut-off state).

Thereby, the column gate 61b becomes the conduction state, and data read by one sense amplifier SA included in SA group 1 are outputted to the data input/output buffer 23 via the common bus 28.

When the column gate 61b has become the conduction state, the Enable 1 signal inputted to the NOR circuit 75 becomes Hi. Accordingly, the output of the NOR circuit 75 becomes Hi, and the connection of the data lines 60c and 60d to the common bus 28 is suppressed similarly to the above.

The output of the NOR circuit 75 outputs Hi when each of the Enable 0 signal and the Enable 1 signal is Lo, that is, when each of the column gates 61a and 61b is in the cut-off state.

The control gate 76 becomes the conduction state when the output of the NOR circuit 75 is Hi. That is, the control gate 76 becomes the conduction state when each of the column gates 61a and 61b is in the cut-off state. Thereby, the bus 77 is connected to the common bus 28. In the gate circuit 26c, when the clock signal CLK2 is set to Hi, the column gate 61c becomes the conduction state, and data read by one sense amplifier SA included in SA group 2 are outputted to the bus 77.

Thus, data read by one sense amplifier SA included in SA group 2 are outputted to the data input/output buffer 23 via the bus 77 and the common bus 28 when each of the column gates 61a and 61b is set to the cut-off state and the clock signal CLK2 is set to Hi.

When the column gate 61c has become the conduction state, the inverted signal of the Enable 2 signal inputted to the AND circuit 74b becomes Lo. Accordingly, in this state, the output of the AND circuit 74b becomes Lo. Consequently, in this state, the column gate 61d is kept in the cut-off state.

The AND circuit 74b outputs Hi when the clock signal CLK3 is Hi and also the inverted signal of the Enable 2 signal is Hi (when the column gate 61c is in the cut-off state).

Thereby, the column gate 61d becomes the conduction state, and data read by one sense amplifier SA included in SA group 3 are outputted to the bus 77.

Thus, data read by one sense amplifier SA included in SA group 3 are outputted to the data input/output buffer 23 via the bus 77 and the common bus 28 when each of the column gates 61a to 61c is set to the cut-off state and the clock signal CLK3 is set to Hi.

Thus, in the gate circuit 26c, the data lines 60a and 60b of SA group 0 and SA group 1 are connected to the common bus 28 preferentially to the data lines 60c and 60d of SA group 2 and SA group 3. In such a way, the priority order of the data lines 60a to 60d can be set arbitrarily. It is also possible to connect the data lines 60c and 60d to the common bus 28 preferentially to the data lines 60a and 60b, for example.

The embodiment described above can provide a semiconductor memory device that can perform writing at high speed. Furthermore, the embodiment can suppress the occurrence of a through current with a simple circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a memory cell array including a plurality of memory cells;
a first data latch electrically connected to the memory cell array;
a second data latch electrically connected to the memory cell array;
a first data bus electrically connected to the first data latch;
a second data bus electrically connected to the second data latch;
a first temporary latch electrically connected to the first data bus;
a second temporary latch electrically connected to the second data bus; and
a control unit configured to write data on the first temporary latch and transfer data retained in the first temporary latch to the first data latch while writing data on the second temporary latch.

2. The semiconductor memory device according to claim 1, wherein a consumption current when data retained in the first temporary latch are transferred to the first data latch is larger than a consumption current when data are written on the first temporary latch.

3. The semiconductor memory device according to claim 1, wherein the control unit transfers data retained in the first data latch to the first temporary latch before writing data on the first temporary latch.

4. The semiconductor memory device according to claim 3, wherein a consumption current when data retained in the first data latch are transferred to the first temporary latch is larger than a consumption current when data are written on the first temporary latch.

5. The semiconductor memory device according to claim 3, wherein the control unit transfers data retained in the second data latch to the second temporary latch before starting writing of data on the second temporary latch.

6. The semiconductor memory device according to claim 1, further comprising:
a first data buffer connected to the first data bus; and
a second data buffer connected to the second data bus,
a length of an interconnection between the first temporary latch and the first data buffer being shorter than a length of an interconnection between the first data latch and the first data buffer, and
a length of an interconnection between the second temporary latch and the second data buffer being shorter than a length of an interconnection between the second data latch and the second data buffer.

7. The semiconductor memory device according to claim 1, further comprising:
a common bus;
a plurality of sense amplifiers provided to correspond to the plurality of memory cells; and
a gate circuit configured to selectively switch the sense amplifier connected to the common bus,
the gate circuit including:
a plurality of data lines each connected to a sense amplifier of one group out of the plurality of sense amplifiers;
a plurality of gates provided between the plurality of data lines and the common bus and configured to switch a conduction state in which the data line is connected to the common bus and a cut-off state in which a connection between the data line and the common bus is cut off; and
a drive circuit configured to switch the plurality of gates to the conduction state or the cut-off state on the basis of a clock signal and provide each of the plurality of data lines with a priority rank to suppress simultaneous connection of the plurality of data lines to the common bus.

8. The semiconductor memory device according to claim 7, wherein
the gate circuit further includes a plurality of frequency dividers provided to correspond to the plurality of gates and configured to frequency-divide the clock signal to generate frequency-divided signals, and
the drive circuit switches the plurality of gates to the conduction state or the cut-off state on the basis of the plurality of frequency-divided signals generated by the plurality of frequency dividers.

9. The semiconductor memory device according to claim 8, wherein the drive circuit sets the gate of the data line of a high priority rank to the conduction state when timings of setting the gate to the conduction state have overlapped in the plurality of frequency-divided signals.

10. The semiconductor memory device according to claim 7, wherein the drive circuit sets higher the priority rank of the data line that is switched to the conduction state at a later timing.

11. The semiconductor memory device according to claim 7, wherein the drive circuit sets higher the priority rank of the data line that is switched to the conduction state at an earlier timing.

12. A semiconductor memory device comprising:
a memory cell array including a plurality of memory cells; and
a control unit capable of performing a write operation on the plurality of memory cells,
the control unit being configured to pass a first consumption current, a second consumption current larger than the first consumption current, and a third consumption current larger than the first consumption current periodically in the write operation, and
an interval between the second consumption current and the third consumption current being different from a period of the second consumption current and a period of the third consumption current.

* * * * *